(12) United States Patent
Wei

(10) Patent No.: US 10,171,123 B2
(45) Date of Patent: Jan. 1, 2019

(54) TRIPLE-GATE PHEMT FOR MULTI-MODE MULTI-BAND SWITCH APPLICATIONS

(71) Applicant: SKYWORKS SOLUTIONS, INC., Woburn, MA (US)

(72) Inventor: Cejun Wei, Burlington, MA (US)

(73) Assignee: SKYWORKS SOLUTIONS, INC., Woburn, MA (US)

(*) Notice: Subject to any disclaimer, the term of this patent is extended or adjusted under 35 U.S.C. 154(b) by 0 days.

(21) Appl. No.: 15/444,520

(22) Filed: Feb. 28, 2017

(65) Prior Publication Data

US 2017/0250725 A1 Aug. 31, 2017

Related U.S. Application Data

(60) Provisional application No. 62/302,879, filed on Mar. 3, 2016, provisional application No. 62/301,084, filed on Feb. 29, 2016.

(51) Int. Cl.
| | |
|---|---|
| *H04B 1/40* | (2015.01) |
| *H03F 3/24* | (2006.01) |
| *H03F 3/19* | (2006.01) |
| *H01L 29/778* | (2006.01) |
| *H01L 29/423* | (2006.01) |
| *H03F 3/193* | (2006.01) |
| *H01L 29/417* | (2006.01) |

(52) U.S. Cl.
CPC .......... *H04B 1/40* (2013.01); *H01L 29/42316* (2013.01); *H01L 29/778* (2013.01); *H03F 3/1935* (2013.01); *H03F 3/245* (2013.01); *H01L 29/41758* (2013.01); *H03F 2200/111* (2013.01); *H03F 2200/174* (2013.01); *H03F 2200/294* (2013.01); *H03F 2200/451* (2013.01)

(58) Field of Classification Search
CPC combination set(s) only.
See application file for complete search history.

(56) References Cited

U.S. PATENT DOCUMENTS

| | | | |
|---|---|---|---|
| 2012/0025188 A1* | 2/2012 | Yamaki | H01L 23/4824 257/48 |
| 2017/0148783 A1* | 5/2017 | Bettencourt | H03F 1/56 |
| 2017/0250725 A1* | 8/2017 | Wei | H04B 1/40 |
| 2017/0317012 A1* | 11/2017 | Imai | H01L 23/4824 |

* cited by examiner

*Primary Examiner* — Tuan H Nguyen
*Assistant Examiner* — Erica L Fleming-Hall
(74) *Attorney, Agent, or Firm* — Lando & Anastasi, LLP

(57) ABSTRACT

A switch element includes a source having a plurality of source fingers and a drain having a plurality of drain fingers interleaved with the source fingers. An active mesa region is defined between at least one of the plurality of source fingers and an adjacent at least one of the plurality of drain fingers. A plurality of gates are disposed between the at least one of the plurality of source fingers and the adjacent at least one of the plurality of drain fingers. At least one of gates extends into the active mesa region from outside of the active mesa region and terminates within the active mesa region.

16 Claims, 10 Drawing Sheets

TRIPLE-GATE PHEMT FOR MULTI-MODE MULTI-BAND SWITCH APPLICATIONS

CROSS-REFERENCE TO RELATED APPLICATION

This application claims priority under 35 U.S.C. § 119(e) to U.S. Provisional Application Ser. No. 62/301,084 titled "IMPROVED TRIPLE-GATE PHEMT FOR MULTI-MODE MULTI-BAND SWITCH APPLICATIONS," filed Feb. 29, 2016 and to U.S. Provisional Application Ser. No. 62/302,879 titled "TRIPLE-GATE PHEMT FOR MULTI-MODE MULTI-BAND SWITCH APPLICATIONS," filed Mar. 3, 2016, each of which is incorporated herein by reference in its entirety for all purposes.

BACKGROUND

Portable communication devices, for example, cellular telephones, are often required to operate over a number of different communication bands. These so-called "multi-band" communication devices use one or more instances of transmit and receive circuitry to generate and amplify the transmit and receive signals. These communication devices may employ a single antenna to transmit and receive the signals over the various communication bands or, in more recent devices, may use multiple antennas, each communicating over various communication bands, such as an antenna for high frequency bands, and another for low and middle frequency bands.

Each antenna in such communication devices is typically connected to the transmit and receive circuitry through switching circuitry, such as a duplexer or a diplexer, or through an isolated switch element, sometimes referred to as a "transmit/receive switch" or an "antenna switch." The switching circuitry or the isolated switch element must effectively isolate the transmit signal from the receive signal. Isolating the transmit signal from the receive signal becomes more problematic in a multiple band communications device where the transmit frequency of one communication band might overlap with the receive frequency of a different communication band.

BRIEF DESCRIPTION OF THE FIGURES

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Aspects and embodiments disclosed herein include a low loss high frequency switch with improved linearity performance. Although described with particular reference to a portable transceiver, the compact low loss high frequency switch with improved linearity performance (also referred to herein as the "compact low loss switch") can be implemented in any transceiver device where the combination of a transmit signal and a blocking signal may overlap a receive band and in which the combined signal may impair receiver performance.

Figure 1:
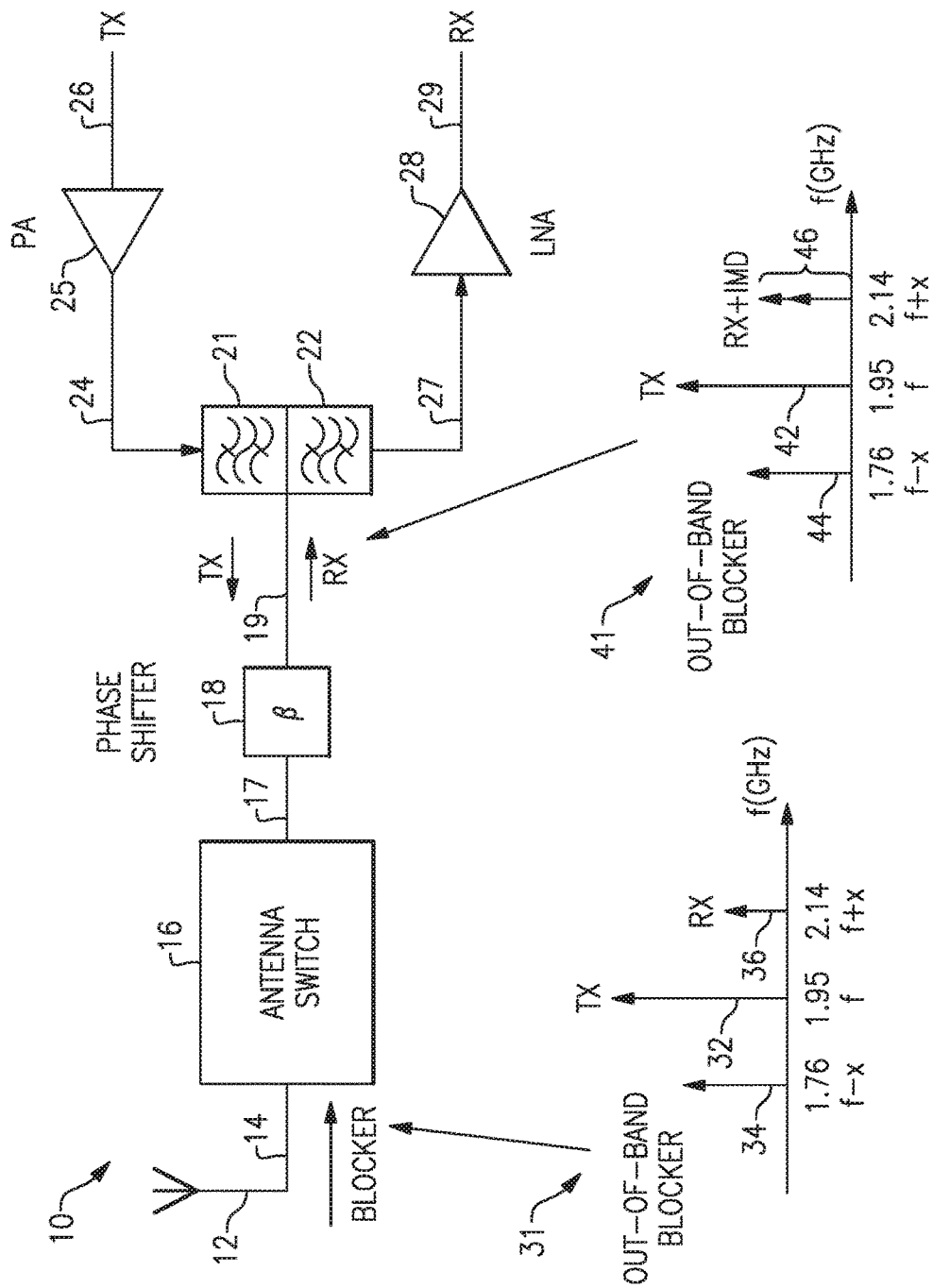
FIG. 1 is a schematic diagram illustrating a portion of a transceiver showing a blocking signal interfering with a received signal.

FIG. 1 is a schematic diagram illustrating a portion of a transceiver 10 showing a blocking signal interfering with a received signal. The transceiver 10 includes an antenna 12 coupled via connection 14 to an antenna switch 16. The antenna switch 16 is coupled via connection 17 to a phase shifter 18. The phase shifter 18 is coupled via bi-directional connection 19 to a transmit filter 21 and to a receive filter 22. The antenna switch 16, phase shifter 18, transmit filter 21, and receive filter 22 form a duplexer. The transmit filter 21 receives an amplified output of a power amplifier 25 via connection 24. The receive filter 22 delivers the receive signal via connection 27 to a low noise amplifier 28. The remainder of the transmit circuitry, the remainder of the receive circuitry and the baseband processing elements are omitted from FIG. 1 for simplicity.

The antenna switch 16 isolates the transmit signal from the receive signal. When implementing a 2G, 3G, or 4G transceiver, linearity and physical size of the antenna switch are significant design factors. Linearity is usually defined by what is referred to as a third order intermodulation product, referred to as IMD3. As shown in FIG. 1, an intermodulation product (IMD) signal may be manifested as mixing products of the transmit (TX) signal with an outside blocker signal falling into the receive (RX) band, as shown using the graphical illustration 41 and specifically, the vector 46, which represents the IMD signal added to the RX signal vector 36. The IMD signal may deteriorate the sensitivity of the receiver if the antenna switch 16 allows a sufficiently high IMD signal.

For multi-band multi-mode switches in modern wireless communications devices, it is desirable to provide small power linearity. For example, for Personal Communications Service (PCS) high-band power of 20 dBm at 1.95 GHz (vectors 32 and 42 in FIG. 1) and small power of −15 dBm at 1.76 GHz (vectors 34 and 44 in FIG. 1), the $3^{rd}$ intermodulation at 2.14 GHz or Wideband Code Division Multiple Access (WCDMA) band should be as low as −110 dBm. Therefore, it would be desirable to have an antenna switch that provides high linearity and low loss in a small area.

Switches in modern wireless communications using pseudomorphic high-electron-mobility transistors (PHEMTs) have demonstrated advantages including low insertion loss, high power and high linearity. To achieve a desired low level of cross modulation or IMD, the PHEMT gate/drain or gate/source voltage is often set to be as negative as about −7V to about −8V. In many implementations, single gate field-effect transistors (SGFETs) are used.

Compared to silicon-on-insulator (SOI) switches, PHEMT multi-mode multi-band switches have a higher price in large-scale production. This is because PHEMT switches using SGFETs occupy a larger area than SOI switches.

To reduce the die size of a switch a multi-gate PHEMT (for example, a triple-gate field-effect transistor (TGFET)) may be utilized instead of a stack of multiple single-gate PHEMT-SGFETs. A TGFET may replace three SGFETs of same size. However, TGFETs are seldom used for this purpose. This is because that the internal gate-to-channel voltages are floating and normally much lower than external gate bias.

To solve the issue of lower floating internal gate-channel voltages in a PHEMT, one may reduce gate leakage or increase drain-source leakage, or the leakages via channels. Many proposals have been put forward to use complex external resistances connecting from one side channel of a gate to the other side channel. Those proposals are typically either too complicated or not effective. For example, if the resistance is put on the end of gate sides and the resistance along the long-width of the channel is too high, the floating voltages vary along the width direction.

Aspects and embodiments disclosed herein include a compact low loss switch that is generally implemented in hardware. However, one or more of the signals that control the compact low loss switch can be implemented in software, or a combination of hardware and software. When implemented in hardware, the compact low loss switch can be implemented using specialized hardware elements. When one or more of the control signals for the compact low loss switch are generated at least partially in software, the software portion can be used to precisely control the operating aspects of various components in the compact low loss switch. The software can be stored in a memory and executed by a suitable instruction execution system (microprocessor). The hardware implementation of the compact low loss switch can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), a separate, specially designed integrated circuit for biasing purposes, etc.

Figure 2:
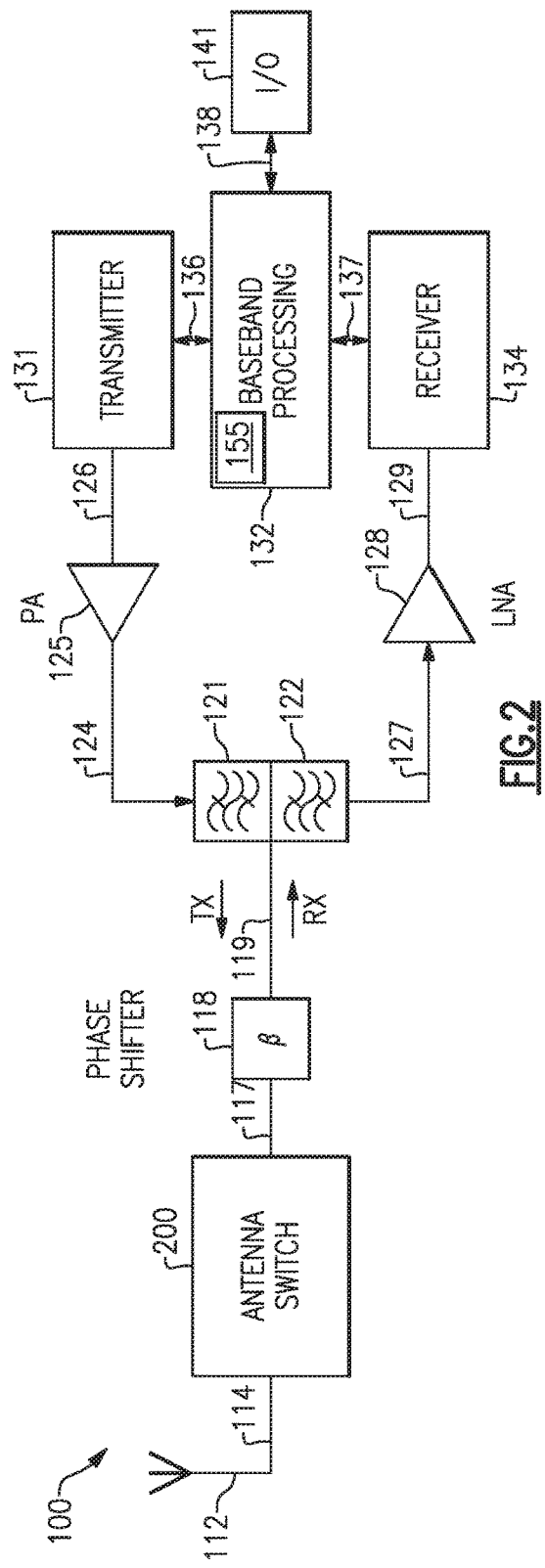
FIG. 2 is a schematic diagram illustrating a portion of a transceiver including an embodiment of a compact low loss switch.

FIG. 2 is a schematic diagram illustrating a portion of a transceiver 100 including an embodiment of a compact low loss switch 200. It should be appreciated that in some communication devices, multiple transceivers 100 may be present for different communication bands, and may be implemented on a common substrate or die, or multiple substrates or die. The transceiver 100 includes an antenna 112 coupled via connection 114 to a compact low loss antenna switch 200. The compact low loss antenna switch 200 is coupled via connection 117 to a phase shift element 118. The phase shift element 118 is coupled via bi-directional connection 119 to a transmit filter 121 and to a receive filter 122. The transmit filter 121 receives an amplified output of a power amplifier 125 via connection 124. A transmitter 131 supplies the transmit signal via connection 126 to the power amplifier 125.

The receive filter 122 delivers the receive signal via connection 127 to a low noise amplifier 128. The output of the low noise amplifier 128 is supplied via connection 129 to a receiver 134. The transmitter 131 and the receiver 134 are shown for illustrative purposes only. Various configurations and implementation of a transmitter and receiver are known to those having ordinary skill in the art and all such implementations are contemplated herein. The transceiver 100 also comprises baseband processing circuitry 132 coupled to the transmitter 131 via connection 136 and coupled to the receiver 134 via connection 137. The baseband processing circuitry performs baseband signal processing for the transmit signal and for the receive signal as known in the art. If one or more portions or aspects of the compact low loss switch 200 are implemented in software, then the baseband processing circuitry includes the compact low loss switch software 155.

The baseband processing circuitry 132 is coupled to an input/output element 141 via connection 138. In an example in which the transceiver 100 is part of a portable communications device, such as a cellular-type telephone, the input/output element 141 may include a microphone, speaker, keyboard, pointing device, or other interface elements.

Figure 3:
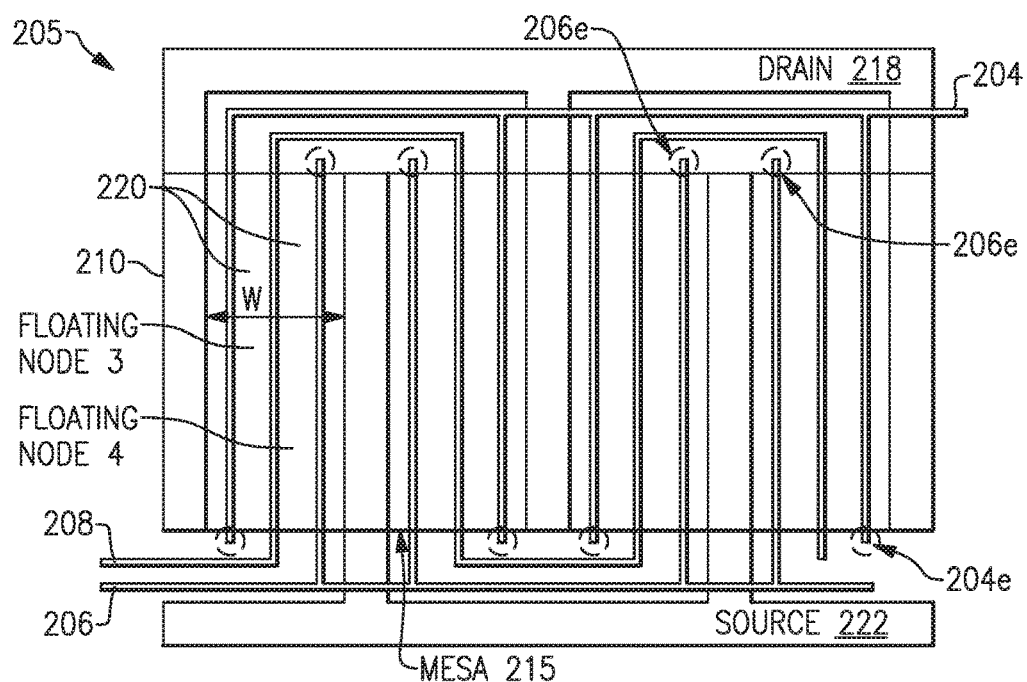
FIG. 3 is a simplified diagram of a three gate PHEMT device.

An exemplary layout of a compact low loss switch having a three gate structure is shown diagrammatically in FIG. 3.

FIG. 3 is a simplified layout diagram of an embodiment of a three gate FET device 205 used in some prior embodiments of the compact low loss switch 200 of FIG. 2. Three gate FET device 205 is a PHEMT. The device 205 comprises a drain 218 and a source 222. Active regions of the drain 218 and source 222 are defined in the active area indicated at 210 in which fingers of the drain 218 and source 222 are interleaved. In this embodiment, three gates 204, 206 and 208 are provided between each interleaved pair of fingers of the drain 218 and source 222. Gate 208 is a meandering gate disposed between the fingers of outer gates 204 and 206. End portions of fingers 204e and 206e of gates 204 and 206, respectively, extend outside the mesa regions 215 and into floating regions 220. Floating regions 220 are defined in the active area 210 between the meandering gate 208 and the outer gates 204, 206. Mesa regions 215 are defined between the interleaved fingers of the drain 218 and source 222 in active area 210.

Figure 4:
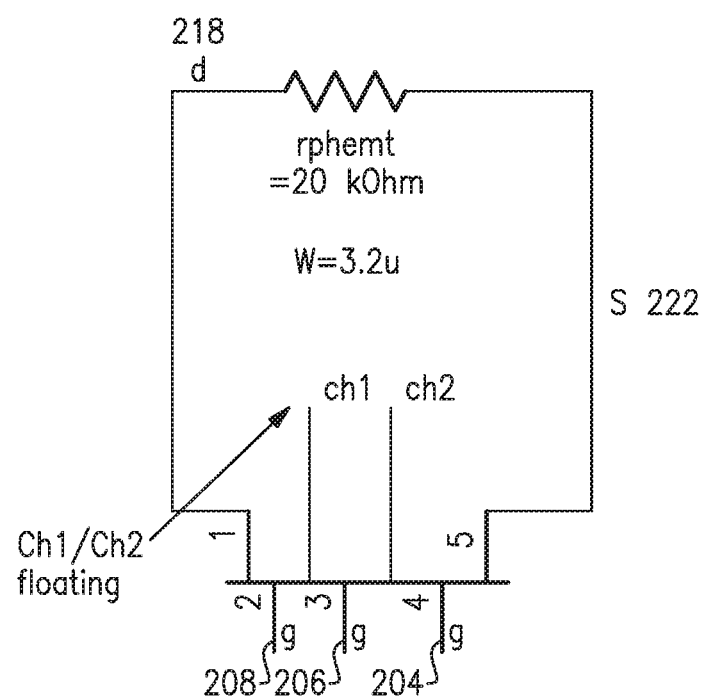
FIG. 4 is an equivalent circuit diagram of the three gate PHEMT device of FIG. 3.
Figure 5:
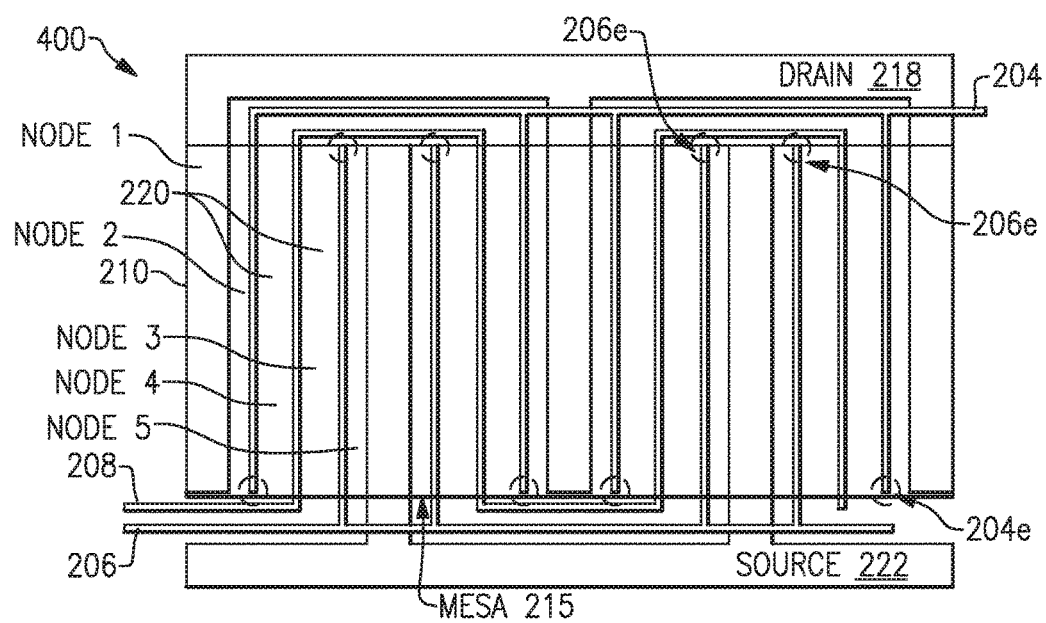
FIG. 5 is a simplified diagram of an embodiment of an improved three gate PHEMT device.

An equivalent circuit diagram of the three gate FET device 205 is illustrated in FIG. 4. As shown, in the example three gate FET device 205 having a drain—source finger spacing W of 7.5 µm, a resistance rphemt between the drain 218 and source 222 may be less than 1Ω in the ON state and 20K Ω in the OFF state. Resistance rphemt is a resistor that is a circuit element in electrical communication between the source and drain that may range in value from approximately 5 kΩ to 100 kΩ and that may have a width of 3.2 µm. The numbers 1-5 in FIG. 4 represent different nodes in the FET 205. These nodes can be at different voltage potentials. Nodes 3 and 4 are floating and can exhibit voltages that vary in an uncontrolled fashion since they are not connected to other circuit elements. As shown in FIG. 3, node 3 is physically located between the meandering gate 208 and outer gate 204 in the active region 210 of the FET 205 and node 4 is physically located between the meandering gate 208 and outer gate 206 in the active region 210 of the FET 205. As illustrated in FIG. 5, node 1 may be on the drain 218 in the active region 210 of the FET 205, node 2 may be located between the drain 218 and the outer gate 204 in the active region 210 of the FET 205, and node 5 may be located between the source 222 and outer gate 206 in the active region 210 of the FET 205. As described below, aspects and embodiments disclosed herein utilize an innovative method to connect nodes 3 and 4 to other circuit elements so that they are controlled and are no longer floating.

A voltage across the drain 218 and source 222 might typically be divided linearly across the spacing W of the FET 205, however, because regions 220 are floating voltage regions the gates 204 and 206 (and associated channels ch1 and ch2 in FIG. 4) are floating. The channels ch1 and ch2 of the FET are areas where electrons are flowing when the FET is in the ON state. Channels ch1 and ch2 are portions of the overall channel where the voltage is floating (at nodes 3 and 4) when the FET is in the OFF state. Allowing for the voltages of gates 204 and/or 206 (and channels ch1 and/or ch2) to float is undesirable. Ideally an even division of the drain—source voltage difference across the electrodes 204, 206, 208 is desired. For example, if the drain—source voltage difference is 18 V, it would be desirable to have a gate 204 to gate 208 voltage difference of 6 V and a gate 208 to gate 206 voltage difference of 6 V. If the voltage differences across these different gate pairs are not equal, IMD3 harmonics may be generated in three gate FET device 205.

An improvement to the three gate FET device 205 is illustrated as three gate FET device 400 in FIG. 5. Three gate FET device 400 is a PHEMT. The three gate FET device 400 is similar to the three gate FET device 205 except that the fingers of gates 204 and 206 terminate at end portions of fingers 204e and 206e within active region 210. This arrangement reduces or eliminates the tendency of gates 204, 206 to exhibit floating voltages and provides for an even voltage division across gates 204, 206, and 208, which in turn reduces the generation of IMD3 harmonics in the three gate FET device 400.

Figure 6:
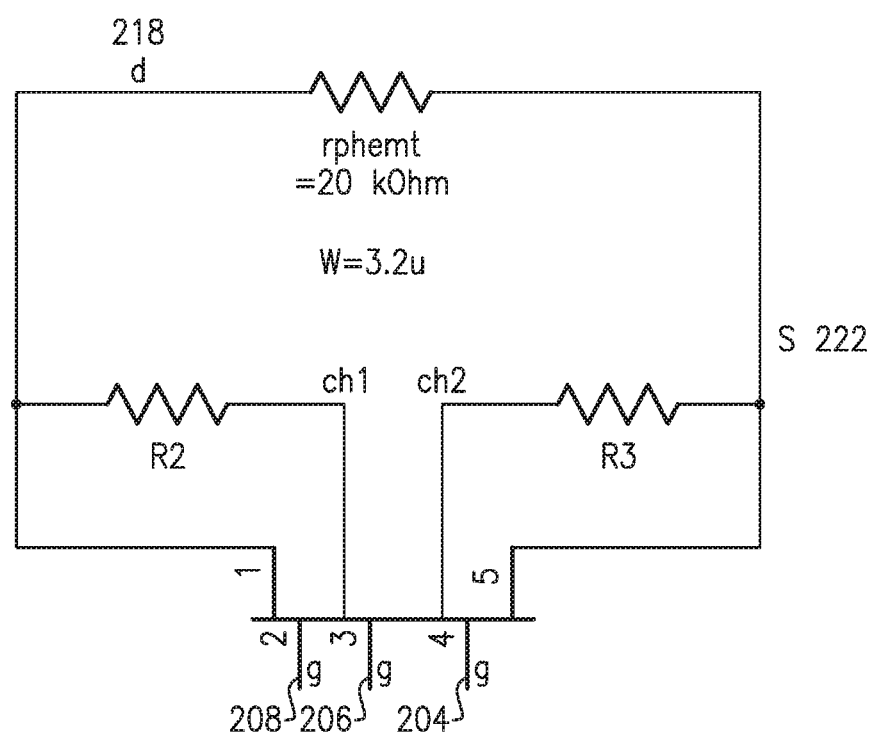
FIG. 6 is an equivalent circuit diagram of the three gate PHEMT device of FIG. 5.

An equivalent circuit diagram for three gate FET device 400 is illustrated in FIG. 6. The value for rphemt remains the same as that as in three gate FET device 205 in both the ON and OFF states, however the voltage potentials of the gates (and associated channels ch1 and ch2) are no longer floating. Rather, effective resistors R2 and R3 are formed between the drain and node 3 and between the source and node 4, respectively. Effective resistors R2 and R3 may have the same or substantially the same resistances, for example, between about 1 kΩ and about 20 kΩ and provide for an even voltage division across the gates 204, 206, 208. Areas 204e and 206e in FIG. 5 form the resistors R2 and R3 illustrated in the FIG. 6 schematic that ensures that the active region between the gates is no longer floating.

Figure 9:
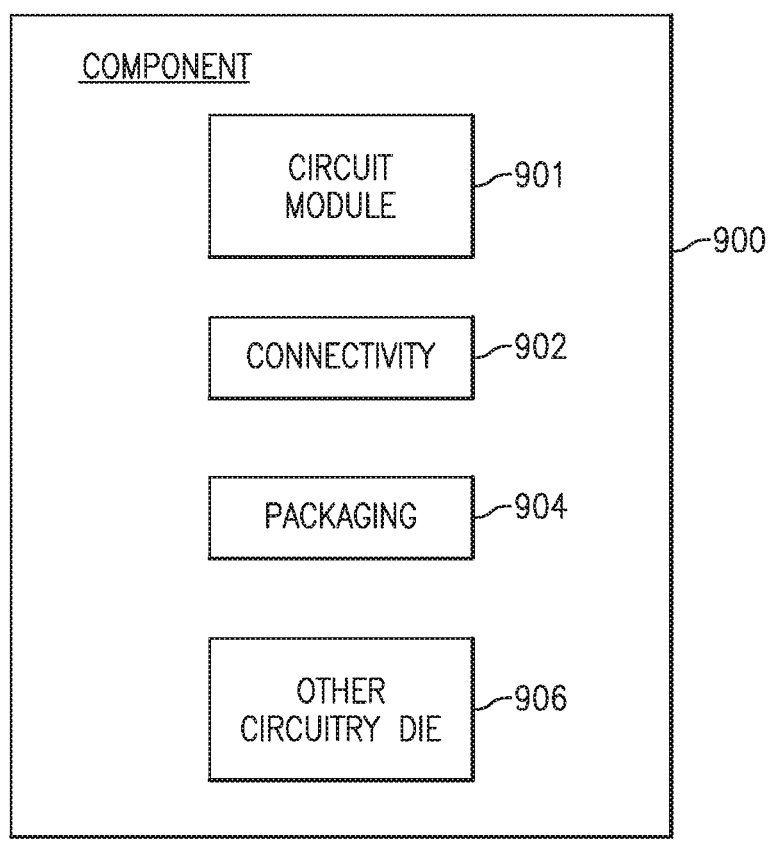
FIG. 9 illustrates and electronic component including the transceiver of FIG. 1 or FIG. 2 incorporating an embodiment of the improved three gate PHEMT device of FIG. 5.

The transceiver 10, 100, including an embodiment of the improved three gate PHEMT 400 disclosed herein may be incorporated into a component that may ultimately be used in a device, such as a wireless communications device, for example, so as to provide a component having enhanced performance. FIG. 9 is a block diagram illustrating one example of a component 900 including an embodiment of transceiver 10, 100, including an embodiment of the improved three gate PHEMT 400 disclosed herein. The embodiment of transceiver 10, 100, including an embodiment of the improved three gate PHEMT 400 disclosed herein is represented in FIG. 9 as circuit block 901. In one embodiment, circuit block 901 includes the circuit modules and circuitry illustrated in FIG. 1 and/or FIG. 2. The component 900 further includes connectivity 902 to provide further signal interconnections, packaging 904, such as for example, a package substrate, for packaging of the circuitry, and other circuitry die 906, such as, for example amplifiers, pre-filters, modulators, demodulators, down converters, and the like, as would be known to one of skill in the art of semiconductor fabrication in view of the disclosure herein.

Figure 10:
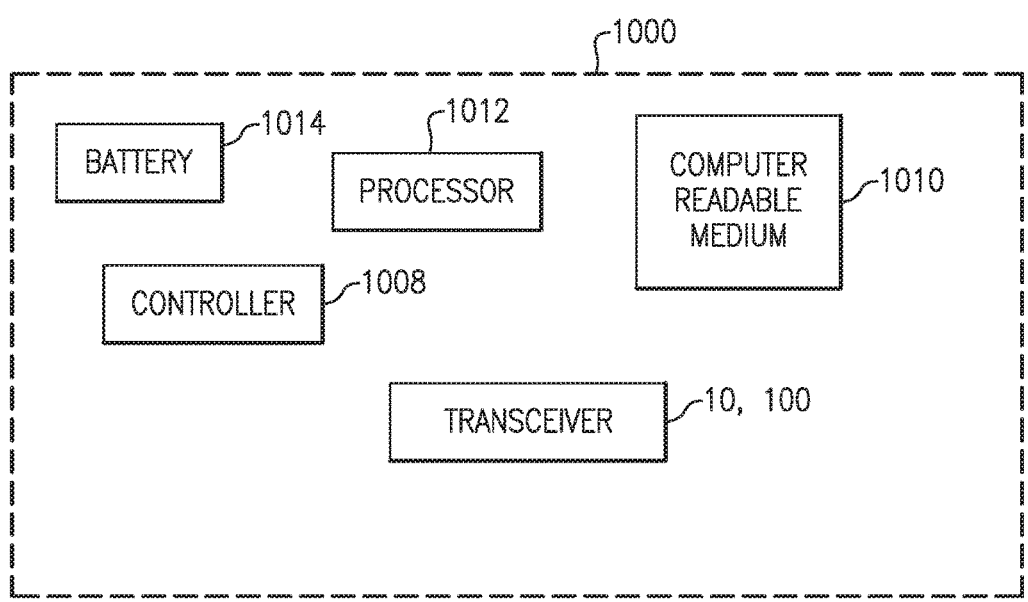
FIG. 10 illustrates a wireless communication device including the transceiver of FIG. 1 or FIG. 2 incorporating an embodiment of the improved three gate PHEMT device of FIG. 5.

Furthermore, configuring transceiver 10,100 to use embodiments of the improved three gate PHEMT 400 disclosed herein can achieve the effect of realizing a communication device having enhanced performance using the same. FIG. 10 is a schematic block diagram of one example of a communication device 1000 (e.g., a wireless or mobile device) that can include the transceiver 10, 100 incorporating an embodiment of the improved three gate PHEMT 400 disclosed herein. The communication device 1000 can represent a multi-band and/or multi-mode device such as a multi-band/multi-mode mobile phone, for example. In certain embodiments, the communication device 1000 can include the transceiver 10, 100. The communication device 1000 can further include a controller 1008, a computer readable medium 1010, a processor 1012, and a battery 1014.

It will be understood that various functionalities associated with the transmission and receiving of RF signals can be achieved by one or more components that are represented in FIG. 10 as the transceiver 10, 100. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 1 and FIG. 2 as the antenna 12, 112. For example, a single antenna can be configured to provide both transmitting and receiving functionalities. In another example, transmitting and receiving functionalities can be provided by separate antennas. In yet another example in which the communication device is a multi-band device, different bands associated with the communication device 1000 can be provided with different antennas.

As shown in FIG. 10, in certain embodiments, a controller 1008 can be provided for controlling various functionalities associated with operations of the transceiver 10, 100 and/or other operating component(s). In certain embodiments, a processor 1012 can be configured to facilitate implementation of various processes for operation of the communication device 1000. The processes performed by the processor 1012 may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for operating the communication device 1000. In certain embodiments, these computer program instructions may also be stored in the computer-readable medium 1010. The battery 1014 can be any suitable battery for use in the communication device 1000, including, for example, a lithium-ion battery.

EXAMPLE

Figure 7:
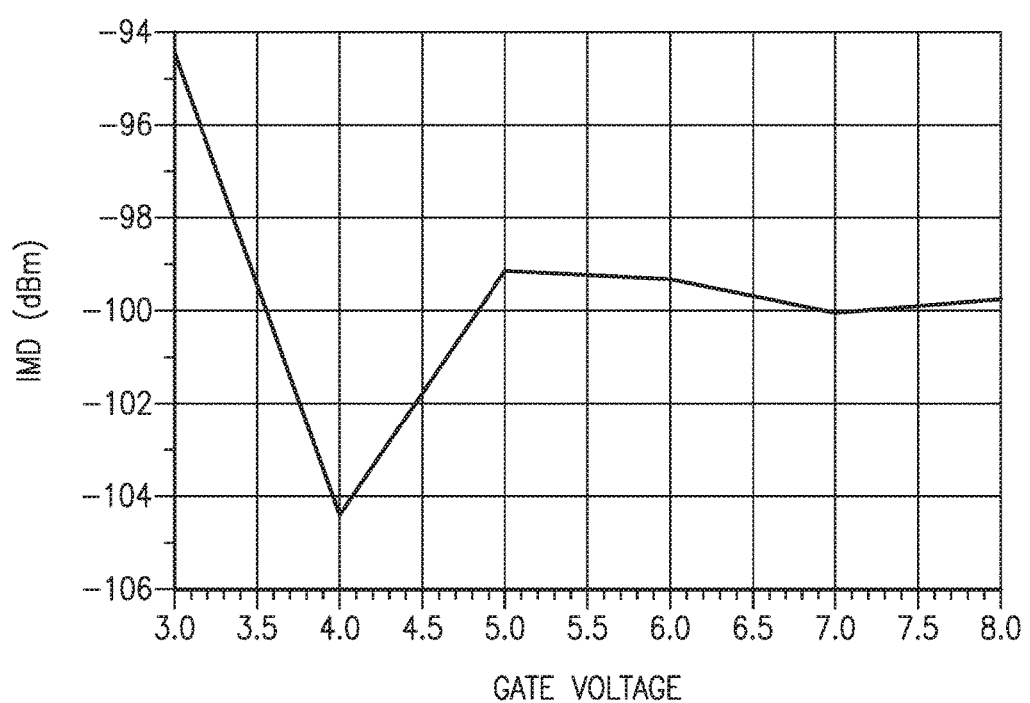
FIG. 7 is a chart illustrating results of a simulation of a device including the three gate PHEMT device of FIG. 3.
Figure 8:
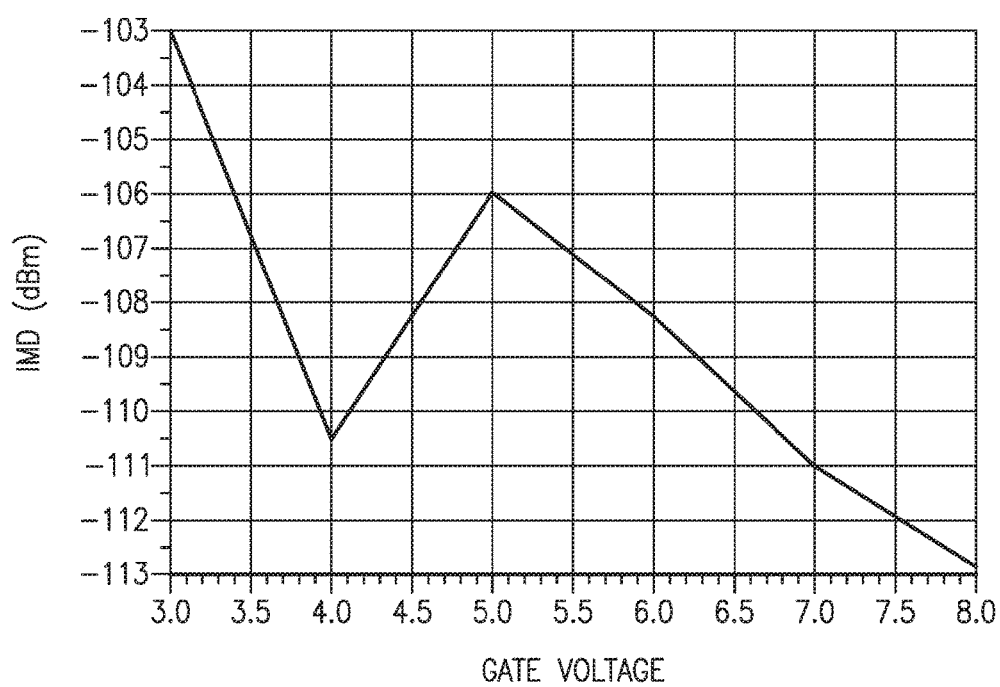
FIG. 8 is a chart illustrating results of a simulation of a device including the three gate PHEMT device of FIG. 5.

Simulations of multi-mode switches including PHEMTs configured as illustrated in FIG. 3 and of multi-mode switches including PHEMTs configured as illustrated in FIG. 5 were performed. A chart of IMD (cross-modulation) as a function of gate bias for the multi-mode switch including PHEMTs configured as illustrated in FIG. 3 is illustrated in FIG. 7. As can be seen in this chart, IMD does not decrease significantly with gate bias above a gate bias of about 5 V and the minimum IMD exhibited is −104 dBm at a gate bias of 4 V. In comparison, a chart of IMD v. gate bias for the multi-mode switch including PHEMTs configured as illustrated in FIG. 5 is illustrated in FIG. 8 and shows an improved IMD that has a value of −110.5 dBm at a gate bias of 4 volts and the IMD decreases with voltage above a gate bias of 5 V.

These simulations show that modifying existing PHEMT designs to include gate electrode fingers that terminate in an active region between interleaved drain and source electrode fingers, rather than extending outside of the active region, may decrease the level of IMD in the device, thus improving the linearity of multi-band multi-mode switches including such modified PHEMTS.

The phraseology and terminology used herein is for the purpose of description and should not be regarded as limiting. As used herein, the term "plurality" refers to two or more items or components. The terms "comprising," "including," "carrying," "having," "containing," and "involving," whether in the written description or the claims and the like, are open-ended terms, i.e., to mean "including but not limited to." Thus, the use of such terms is meant to encompass the items listed thereafter, and equivalents thereof, as well as additional items. Only the transitional phrases "consisting of" and "consisting essentially of," are closed or semi-closed transitional phrases, respectively, with respect to the claims. Use of ordinal terms such as "first," "second," "third," and the like in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several aspects of at least one embodiment, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A switch element comprising:
   a source including a plurality of source fingers and a drain including a plurality of drain fingers interleaved with the source fingers;
   an active mesa region defined between at least one of the plurality of source fingers and an adjacent at least one of the plurality of drain fingers; and
   a plurality of gates disposed between the at least one of the plurality of source fingers and the adjacent at least one of the plurality of drain fingers, at least one of the plurality of gates including a finger extending into the active mesa region from outside of the active mesa region and terminating within the active mesa region, the plurality of gates including a first gate, a second gate, and a third gate, a non-zero voltage difference across the source and the drain being evenly divided between the first gate, the second gate, and the third gate.

2. The switch element of claim 1 wherein a finger of the first gate extends into the active mesa region from a first side outside of the active mesa region and terminates in the active mesa region, and a finger of the second gate extends into the active mesa region from a second side outside of the active mesa region and terminates in the active mesa region.

3. The switch element of claim 2 wherein the third gate is disposed between the finger of the first gate and the finger of the second gate.

4. The switch element of claim 3 wherein the third gate includes a portion disposed in the first side outside of the active mesa region and a portion disposed in the second side outside of the active mesa region.

5. The switch element of claim 4 wherein the first gate includes a portion disposed in the first side outside of the active mesa region.

6. The switch element of claim 5 wherein the finger of the first gate extends from the portion of the first gate disposed in the first side outside of the active mesa region into the active mesa region.

7. The switch element of claim 5 wherein the second gate includes a portion disposed in the second side outside of the active mesa region.

8. The switch element of claim 7 wherein the finger of the second gate extends from the portion of the second gate disposed in the second side outside of the active mesa region into the active mesa region.

9. The switch element of claim 1 configured for use with radio frequency signals.

10. The switch element of claim 1 comprising a pseudomorphic high-electron-mobility transistor.

11. A transceiver comprising:
    an antenna;
    a transmitter associated with a transmit signal, the transmitter operatively coupled to the antenna;
    a receiver associated with a receive signal, the receiver operatively coupled to the antenna; and
    a switch element coupled to the antenna and configured to isolate the transmit signal and the receive signal, the switch element having a source including a plurality of source fingers and a drain including a plurality of drain fingers interleaved with the source fingers, an active mesa region defined between at least one of the plurality of source fingers and an adjacent at least one of the plurality of drain fingers, and a plurality of gates disposed between the at least one of the plurality of source fingers and the adjacent at least one of the plurality of drain fingers, at least one of the plurality of gates extending into the active mesa region from outside of the active mesa region and terminating within the active mesa region, the plurality of gates including a first gate, a second gate, and a third gate, a non-zero voltage difference across the source and the drain being evenly divided between the first gate, the second gate, and the third gate.

12. The transceiver of claim 11 further including a phase shifter, the switch element configured to electrically couple the antenna to the phase shifter.

13. The transceiver of claim 12 further including a power amplifier coupled to the phase shifter via a transmit filter.

14. The transceiver of claim 12 further including a low noise amplifier coupled to the phase shifter via a receive filter.

15. An electronic component including the transceiver of claim 11.

16. A wireless communication device including the transceiver of claim 11.

* * * * *

UNITED STATES PATENT AND TRADEMARK OFFICE
CERTIFICATE OF CORRECTION

PATENT NO. : 10,171,123 B2  
APPLICATION NO. : 15/444520  
DATED : January 1, 2019  
INVENTOR(S) : Cejun Wei Page 1 of 1

It is certified that error appears in the above-identified patent and that said Letters Patent is hereby corrected as shown below:

In the Specification

Column 4, Line 36, delete "204$e$and" and insert -- 204$e$ and --.
Column 5, Line 27, delete "204$e$and 206$e$within" and insert -- 204$e$ and 206$e$ within --.

Signed and Sealed this
Nineteenth Day of February, 2019

Andrei Iancu
*Director of the United States Patent and Trademark Office*